United States Patent
Peng et al.

(10) Patent No.: US 12,101,891 B2
(45) Date of Patent: Sep. 24, 2024

(54) CIRCUIT BOARD AND MANUFACTURING METHOD THEREFOR

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Chao Peng, Shenzhen (CN); Ke He, Shenzhen (CN); Chih-Hung Chen, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 383 days.

(21) Appl. No.: 17/780,963

(22) PCT Filed: May 20, 2020

(86) PCT No.: PCT/CN2020/091423
§ 371 (c)(1),
(2) Date: May 27, 2022

(87) PCT Pub. No.: WO2021/232322
PCT Pub. Date: Nov. 25, 2021

(65) Prior Publication Data
US 2023/0007782 A1    Jan. 5, 2023

(51) Int. Cl.
*H05K 1/02*    (2006.01)
*H05K 1/11*    (2006.01)
*H05K 3/06*    (2006.01)

(52) U.S. Cl.
CPC ............. *H05K 3/06* (2013.01); *H05K 1/0216* (2013.01); *H05K 1/115* (2013.01); *H05K 2201/0129* (2013.01); *H05K 2201/09563* (2013.01)

(58) Field of Classification Search
CPC .................. H05K 3/06; H05K 1/0216; H05K 2201/09563
See application file for complete search history.

(56) References Cited

U.S. PATENT DOCUMENTS 6,353,189 B1 *   3/2002   Shimada   ........... H01L 23/49827
                                                  257/E23.105
6,486,394 B1 *  11/2002   Schmidt   ............... H05K 9/0039
                                                          174/262

(Continued)

*Primary Examiner* — Sherman Ng
(74) *Attorney, Agent, or Firm* — ScienBiziP, P.C.

(57) ABSTRACT

A manufacturing method of a circuit board includes: providing a first double-sided copper laminate including a dielectric layer, a first copper foil layer and a copper plating layer, wherein the dielectric layer, wherein the dielectric layer defines a groove, the copper plating layer includes a first copper plating portion in the groove and a second copper plating portion beside the first copper plating portion. A double-sided circuit substrate including base layer and two first wiring layers is provided, wherein each first wiring layer includes a signal line. Conductive paste blocks are disposed in the base layer and on both sides of the signal line; and a first double-sided copper laminate is stacked on each side of the double-sided circuit substrate, disposing the signal line in the groove. The conductive paste blocks are pressed electrically connect same to the second copper plating portions. The present disclosure further provides a circuit board.

20 Claims, 10 Drawing Sheets

(56) References Cited

U.S. PATENT DOCUMENTS

| | | | |
|---|---|---|---|
| 2004/0040739 A1* | 3/2004 | Yoshimura | H05K 1/0221 174/255 |
| 2007/0257339 A1* | 11/2007 | Chen | H05K 1/0219 257/665 |
| 2009/0178273 A1* | 7/2009 | Lauffer | H05K 3/462 29/830 |

* cited by examiner

CIRCUIT BOARD AND MANUFACTURING METHOD THEREFOR

FIELD

The disclosure relates to circuit board manufacturing, and more particularly, to a circuit board and a manufacturing method of the circuit board.

BACKGROUND

Majority of signal loss in a printed circuit board can be divided into two portions. One portion is called conduction loss, which means a loss caused by transmission in a copper foil. The other is dielectric loss, which means a loss caused by transmission in a dielectric layer. Generally, the signal loss is related to dielectric constant $D_k$ and dielectric loss factor $D_f$ of the material of the dielectric layer. In order to reduce the signal loss, a dielectric material with low dielectric constant and low dielectric loss factor is needed.

Liquid crystal polymer (LCP) and Teflon are common dielectric materials. Due to the relatively low dielectric constant and dielectric loss factor, they are widely used in the dielectric layer of the printed circuit board. However, such materials are expensive and the available amounts are limited, which is not conducive to a batch production of the circuit boards. Moreover, such materials still have a certain dielectric constant and a certain dielectric loss factor. When requirements for the control of signal loss are high, such materials cannot meet the demand for further reducing the signal loss.

SUMMARY

To overcome the above shortcomings, a circuit board and a manufacturing method of the circuit board are needed.

The present disclosure provides a manufacturing method of a circuit board, including a manufacturing method of a circuit board, including:
  providing a first double-sided copper laminate, wherein the first double-sided copper laminate includes a dielectric layer, and a first copper foil layer and a copper plating layer formed on two surfaces of the dielectric layer, the dielectric layer defines a groove passing through the dielectric layer, the first copper foil layer is disposed on a side of the groove to form a bottom wall of the groove, the dielectric layer further forms a sidewall where the groove is defined, the sidewall is connected to the bottom wall, the copper plating layer includes a first copper plating portion on the bottom wall and the sidewall, and a second copper plating portion besides the first copper plating portion;
  providing a double-sided circuit substrate, wherein the double-sided circuit substrate includes a base layer and two first wiring layers formed on two surfaces of the base layer, each of the two first wiring layers includes a signal line, a region of the base layer not covered by the signal line defines two conductive paste blocks, the two conductive paste blocks are disposed on two sides of the signal line;
  stacking a first double-sided copper laminate on each of two sides of the double-sided circuit substrate, causing the signal line to be received in the groove, to obtain an intermediate body;
  pressing the intermediate body, causing the two conductive paste blocks to electrically connect to the second copper plating portions on the two sides of the base layer, wherein the second copper plating portion forms a ground line, the first copper plating portion forms a shielding layer, the shielding layer and the ground line on each of the two sides of the base layer and the two conductive paste blocks cooperatively form a closed shielding sleeve, the signal wire is disposed within the shielding sleeve; and
  etching the first copper foil layer of each first double-sided copper laminate to obtain a second conductive circuit layer, thereby obtaining the circuit board.

The present disclosure further provides a circuit board, including:
  a double-sided circuit substrate, wherein the double-sided circuit substrate includes a base layer and two first wiring layers formed on two surfaces of the base layer, each of the two first wiring layers includes a signal line, two conductive paste blocks are disposed in a region of the base layer not covered by the signal line, the two conductive paste blocks are disposed on two sides of the signal line; and
  a copper plating layer, a dielectric layer, and a second wiring layer formed in that order on each of the two first wiring layers, wherein the dielectric layer defines a groove passing through the dielectric layer, the first copper foil layer is disposed on a side of the groove to form a bottom wall of the groove, the dielectric layer further forms a sidewall where the groove is defined, the sidewall is connected to the bottom wall, the copper plating layer includes a first copper plating portion on the bottom wall and the sidewall, and a second copper plating portion besides the first copper plating portion;
  wherein the two conductive paste blocks are electrically connected to the second copper plating portions on the two sides of the base layer, wherein the second copper plating portion forms a ground line, the first copper plating portion forms a shielding layer, the shielding layer and the ground line on each of the two sides of the base layer and the two conductive paste blocks cooperatively forming a closed shielding sleeve, the signal wire is disposed within the shielding sleeve.

In the present disclosure, the copper plating layer on the bottom wall and the sidewall forms the shielding layer. The shielding layer and the ground line on both sides of the base layer and the conductive pastes cooperatively form a closed shielding sleeve. The signal lines are disposed within the shielding sleeve. Since air, which has dielectric constant of 1 is in the shielding sleeve, the dielectric loss is minimized. Furthermore, since the present disclosure does not rely on the use of existing expensive dielectric materials to minimize the dielectric loss, the manufacturing process is mature and simple, the cost is low, and it is conducive to the batch production of circuit boards.

Figure 1:
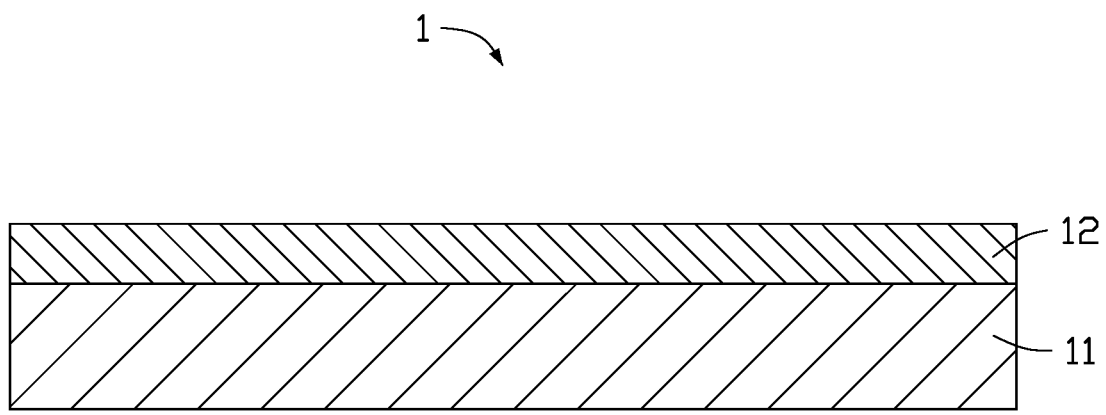
FIG. 1 is a cross-sectional view of a single-sided copper laminate according to an embodiment of the present disclosure.

Symbol description of main components:
single-sided copper laminate 1; second double-sided copper laminate 2; first double-sided copper laminate 10; dielectric layer 11; first copper foil layer 12; copper plating layer 13; second wiring layer 14; double-sided circuit board 20; base layer 21; first wiring layer 22; second copper foil layer 23; photoresist pattern layer 24; shielding sleeve 30; protective layer 40: circuit board 100; groove 110; bottom wall 111; sidewall 112; first copper plating portion 131; second copper plating portion 132; through hole 210; conductive paste block 211; signal line 220.

Many aspects of the disclosure may be better understood with reference to the drawings.

DETAILED DESCRIPTION

Referring to FIGS. 1 to 10, an embodiment of the present disclosure provides a manufacturing method of a circuit board 100, which includes the following steps.

Figure 2:
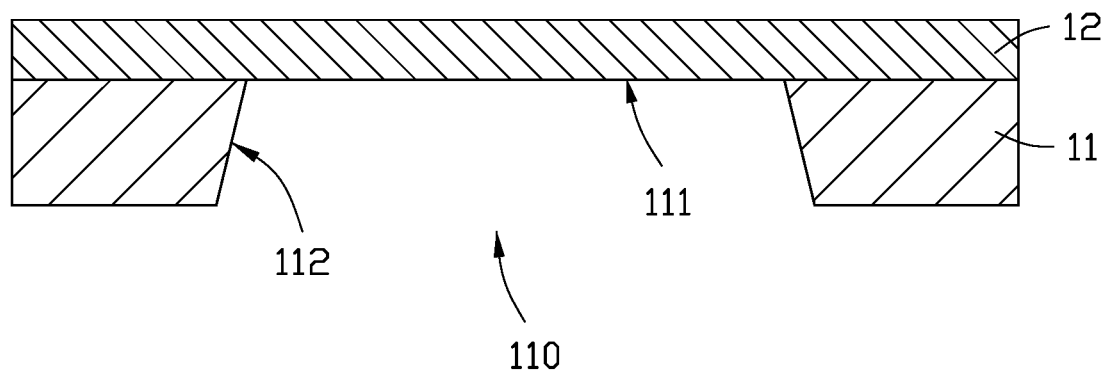
FIG. 2 is a cross-sectional view showing a groove defined in a dielectric layer of the single-sided copper laminate of FIG. 1.
Figure 3:
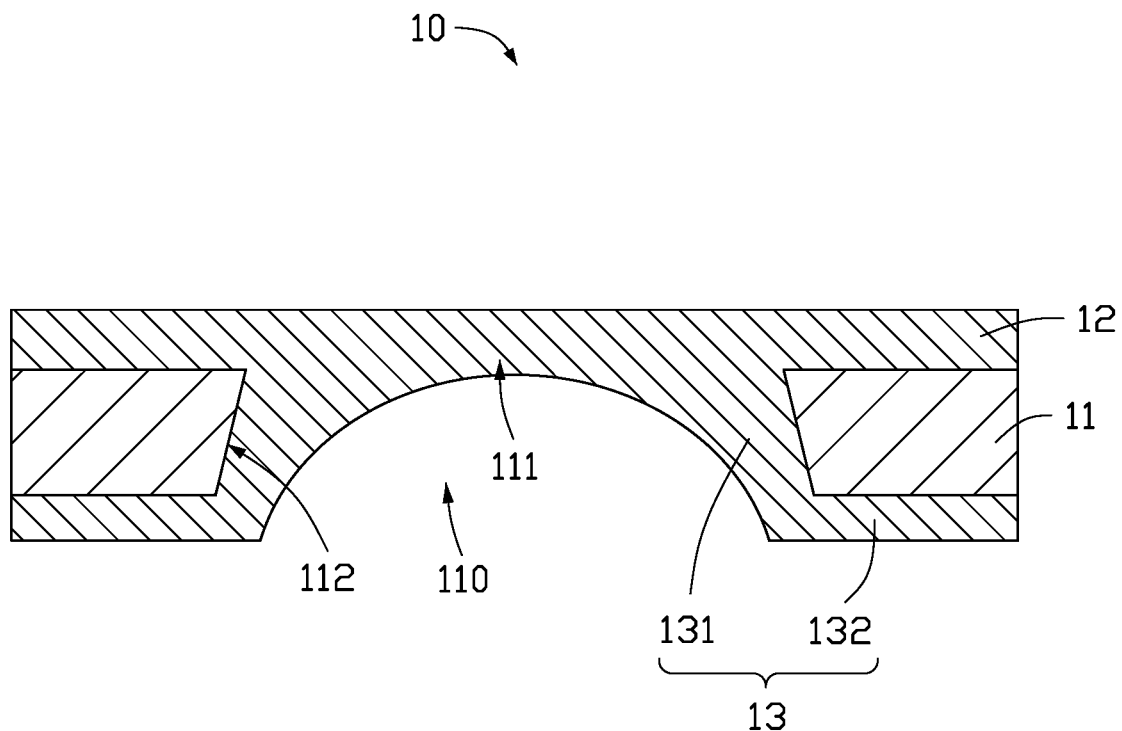
FIG. 3 is a cross-sectional view of a double-sided copper laminate obtained by forming a copper plating layer on the dielectric layer of FIG. 2.

In step S1, referring to FIGS. 1 to 3, a first double-sided copper laminate 10 is provided. The first double-sided copper laminate 10 includes a dielectric layer 11, a first copper foil layer 12, and a copper plating layer 13 formed on opposite surfaces of the dielectric layer 11.

The dielectric layer 11 defines a groove 110 passing through the dielectric layer 11. The first copper foil layer 12 is disposed on a side of the groove 110 and forms a bottom wall 111 of the groove 110. The dielectric layer 11 further forms a sidewall 112 where the groove 110 is defined, and the sidewall 112 is connected to the bottom wall 111. The copper plating layer 13 includes a first copper plating portion 131 and a second copper plating portion 132. The first copper plated portion 131 is formed on the bottom wall 111 and the sidewall 112. The second copper plating portion 132 is the portion of the copper plating layer 13 besides the first copper plating portion 131. That is, the second copper plating portion 132 is formed on a surface of the dielectric layer 11 without the groove 110.

In this embodiment, a cross-sectional width of the groove 110 gradually decreases from the dielectric layer 11 to the first copper foil layer 12. More specifically, along an extension direction of the groove 110, a cross-section of the groove 110 is trapezoidal.

Furthermore, a surface of the first copper plating portion 131 away from the groove 110 is arcuate. A surface of the second copper plating portion 132 is flat.

In this embodiment, the dielectric layer 11 may be made of a material selected from epoxy resin, polypropylene (PP), BT resin, polyphenylene oxide (PPO), polyimide (PI), polyethylene terephthalate (PET), polyethylene naphthalate (PEN), and any combination thereof. More specifically, the dielectric layer 11 is made of a thermosetting resin.

In this embodiment, a manufacturing method of the first double-sided copper laminate 10 includes the following steps.

In the first step, referring to FIG. 1, a single-sided copper laminate 1 is provided. The single-sided copper laminate 1 includes the dielectric layer 11 and the first copper foil layer 12 formed on the dielectric layer 11.

In the second step, referring to FIG. 2, the groove 110 is opened in the dielectric layer 11, which passes through the dielectric layer 11. The groove 110 may be formed by punching, CNC drilling, or laser drilling.

In the third step, referring to FIG. 3, copper is plated on the surface of the dielectric layer 11 away from the first copper foil layer 12, the bottom wall 111, and the sidewall 112 to form the copper plating layer 13. Then, the first double-sided copper laminate 10 is obtained.

In step S2, referring to FIGS. 4 to 7, a double-sided circuit substrate 20 is provided, which includes a base layer 21 and two first wiring layers 22 formed on the opposite surfaces of the base layer 21.

Each of the first wiring layers 22 includes a signal line 220. An extension direction of the signal line 220 is the same as the extension direction of the groove 110.

Furthermore, the signal lines 220 of the two first wiring layers 22 correspond to each other. That is, projections of the signal lines 220 of the two first wiring layers 22 on the base layer 21 overlap with each other.

A region of the base layer 21 not covered by the signal line 220 defines two through holes 210. The two through holes 210 are disposed at two sides of the signal line 220. A conductive paste block 211 is disposed in each of the through holes 210. Ends of the conductive paste 211 may protrude from the base layer 21. In this embodiment, the conductive paste block 211 includes, but is not limited to, a copper paste or a solder paste.

In this embodiment, the base layer 21 may be selected from a group consisting of epoxy resin, polypropylene, BT resin, polyphenylene ether, polyimide, polyethylene terephthalate, polyethylene naphthalate, and any combination thereof. More specifically, the base layer 21 is made of a thermoplastic resin.

In this embodiment, a manufacturing method of the double-sided circuit substrate 20 includes the following steps.

Figure 4:
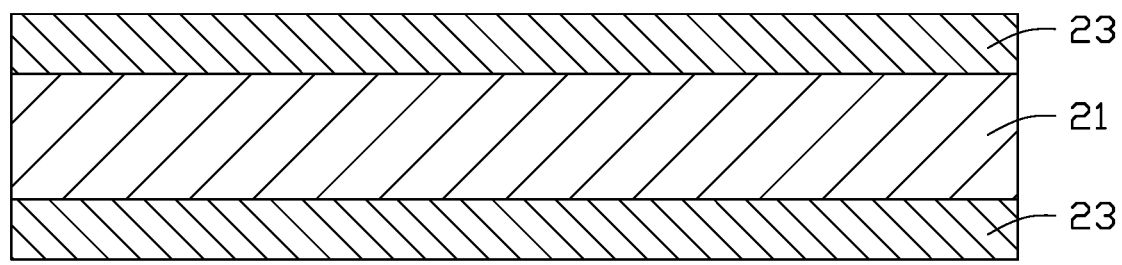
FIG. 4 is a cross-sectional view of a double-sided copper laminate according to an embodiment of the present disclosure.

In the first step, referring to FIG. 4, a second double-sided copper laminate 2 is provided. The second double-sided copper laminate 2 includes the base layer 21 and two second copper foil layers 23 formed on the opposite surfaces of the base layer 21.

Figure 5:
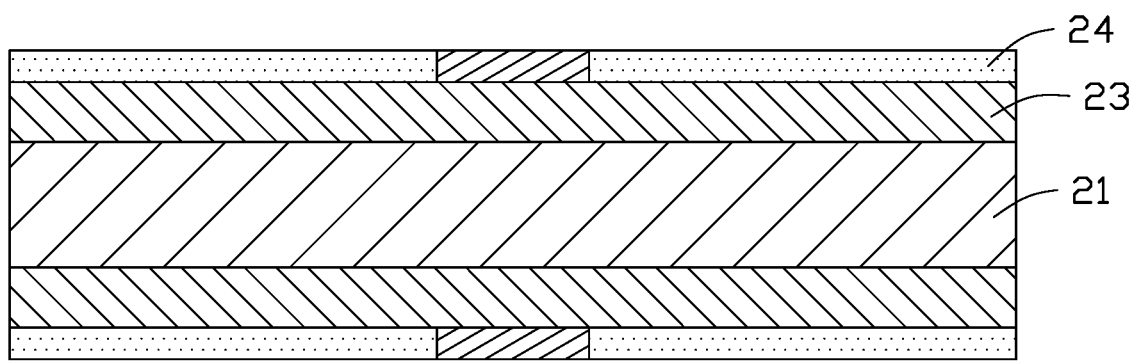
FIG. 5 is a cross-sectional view showing a photoresist pattern layer formed on the double-sided copper laminate of FIG. 4.

In the second step, referring to FIG. 5, a photoresist pattern layer covers each of the second copper foil layers 23.

Figure 6:
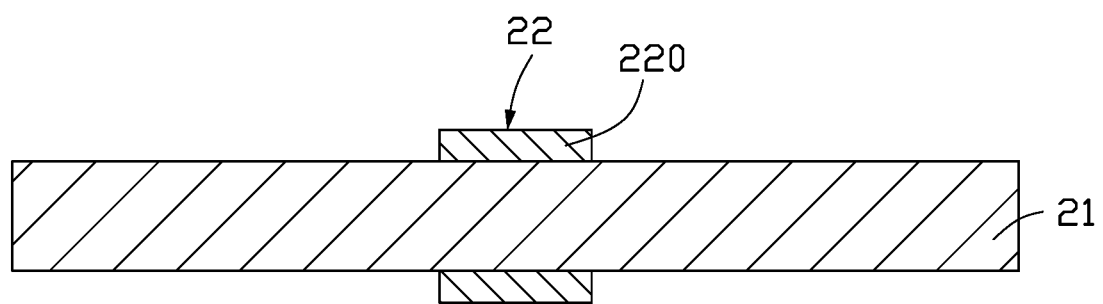
FIG. 6 is a cross-sectional view showing a second copper foil layer of the double-sided copper laminate etched through the photoresist pattern layer of FIG. 5.

In the third step, referring to FIG. 6, the second copper foil layer 23 is subjected to an exposure and development process through the photoresist pattern layer 24. Thus, by etching, the second copper foil layer 23 becomes the first wiring layer 22.

Figure 7:
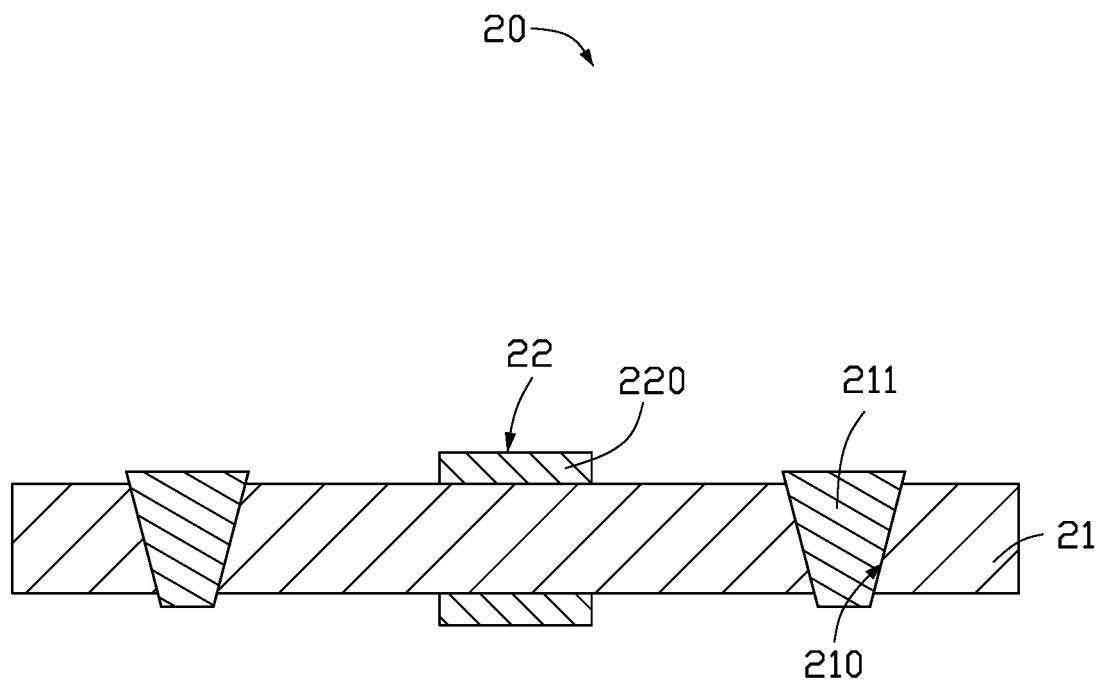
FIG. 7 is a cross-sectional view of a double-sided circuit substrate obtained after forming a conductive paste block in a base layer of FIG. 6.

In the fourth step, referring to FIG. 7, two through holes 210 are defined in the region of the first base layer 21 not covered by the signal line 220, and the conductive paste block 211 is placed in each of the two through holes 210. The two conductive paste blocks 211 are disposed on two sides of the signal line 220 to obtain the double-sided circuit substrate 20.

Figure 8:
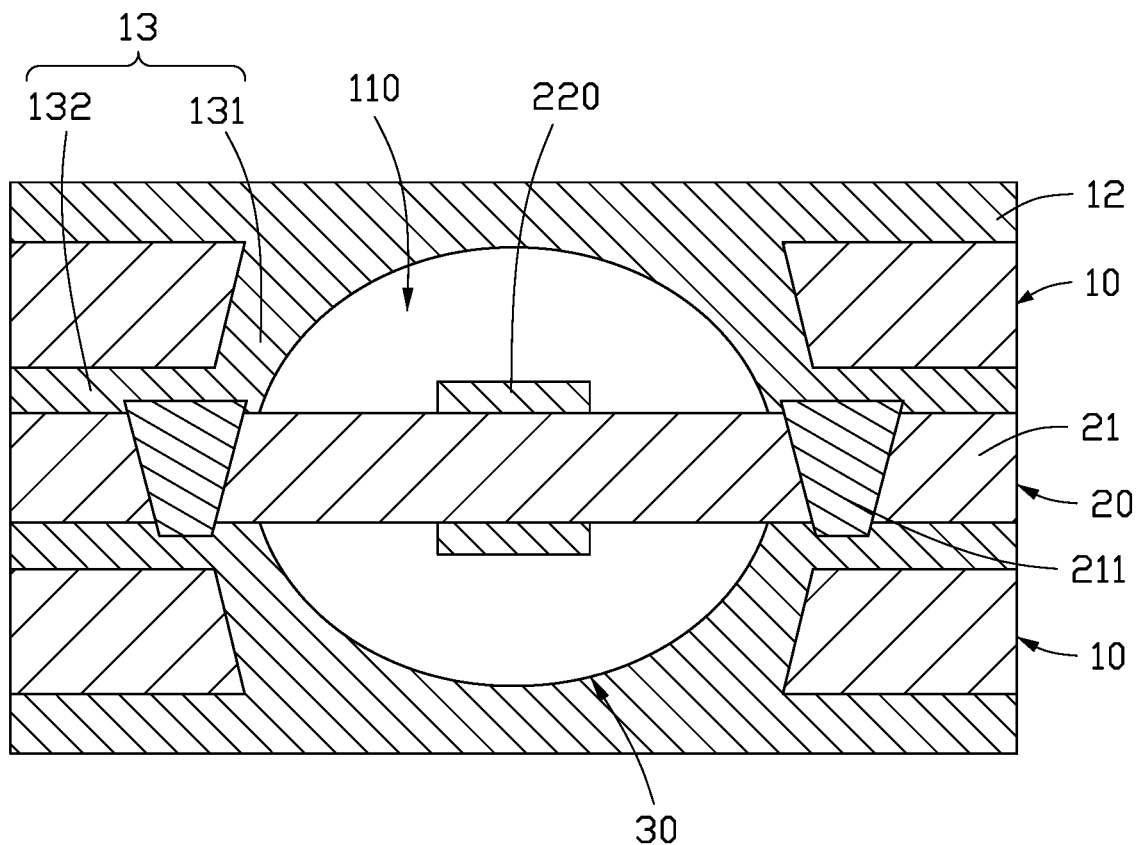
FIG. 8 is a cross-sectional view showing the double-sided copper laminate of FIG. 3 and the double-sided circuit substrate of FIG. 7 stacked and pressed together.

In step S3, referring to FIG. 8, two first double-sided copper laminates 10 are applied on both sides of the double-sided circuit substrate 20, thereby each signal line 220 is disposed in the corresponding groove 110. Then, an intermediate body (not shown is obtained.

In step S4, the intermediate body is pressed, causing the conductive paste 211 to electrically connect to the second copper plating portion 132 of the two copper plating layers 13 disposed on two sides of the base layer 21.

A distance between the two conductive paste blocks 211 may be set according to a width of an opening defined by the groove 110 (that is, the width of the opening defined by the groove 110 on the surface of the dielectric layer 11 away from the first copper foil layer 12). In this embodiment, the distance between the two conductive paste blocks 211 is substantially equal to the width of the opening defined by the groove 110. In another embodiment, the distance between the two conductive paste blocks 211 may also be greater than the width of the opening defined by the groove 110, as long as the conductive paste block 211 can be electrically connected to two second copper plating portions 132 disposed on both sides of the dielectric layer 11 during the pressing.

The second copper plating portion 132 forms a ground line. The first copper plating portion 131 forms a shielding layer. The shielding layer and the ground line on each side of the base layer 21 and the conductive pastes 211 cooperatively form a closed shielding sleeve 30. The signal lines 220 are disposed within the shielding sleeve 30. Since air, which has dielectric constant equal to 1, fills the shielding sleeve 30, the dielectric loss is minimized.

Furthermore, arranging the signal lines 220 in the shielding sleeve 30 avoids electromagnetic interference between the signal lines 220 and other lines (not shown). The electromagnetic field during signal transmission is kept in the shielding sleeve 30, thereby improving a speed of signal transmission. In this embodiment, the signal lines 220 are disposed along a central axis of the shielding sleeve 30, which further improves the electromagnetic shielding effect and the signal transmission speed.

Moreover, the shielding sleeve 30 being arcuate can withstand a certain pressure along the vertical direction, so that the circuit board 100 formed has a better impact resistance. When the dielectric layer 11 is made of a thermosetting resin (such as epoxy resin), the impact resistance of the circuit board 100 is further increased.

Figure 9:
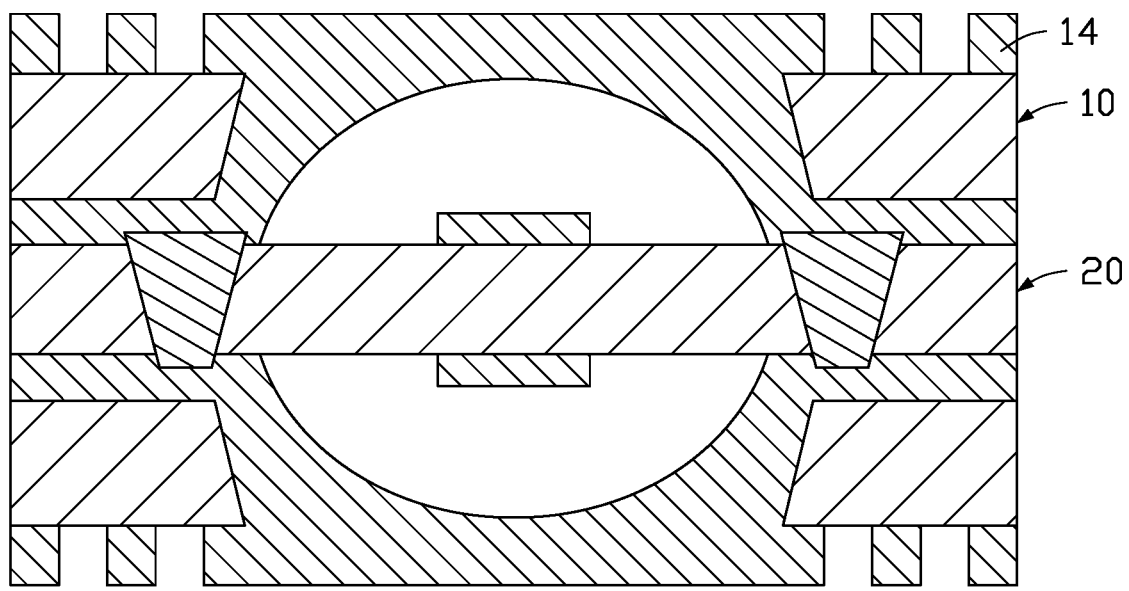
FIG. 9 is a cross-sectional view showing a first copper foil layer of FIG. 8 etched to form a second wiring layer.

In step S5, referring to FIG. 9, the first copper foil layer 12 of each first double-sided copper laminate 10 is etched to obtain a second wiring layer 14.

Figure 10:
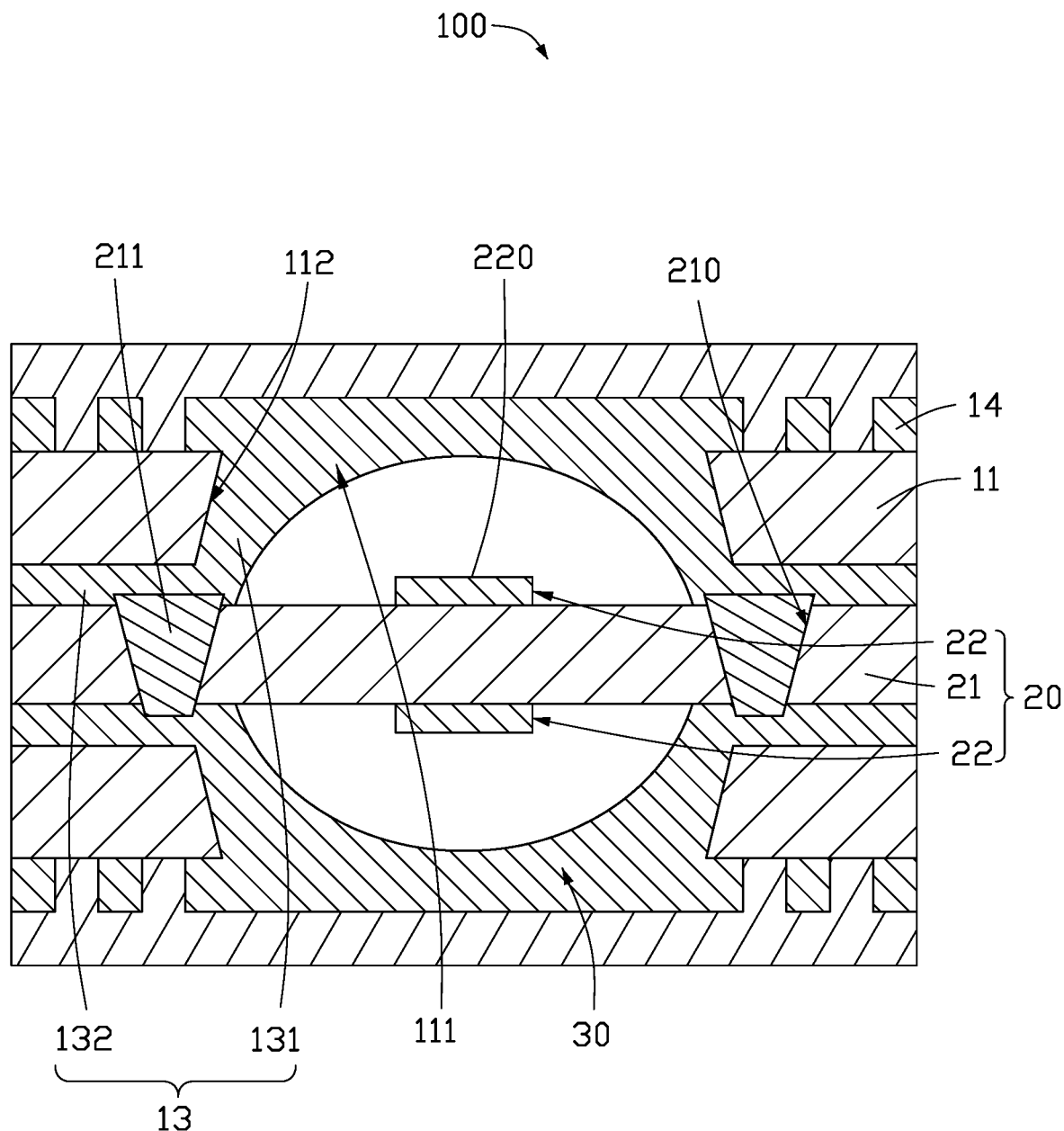
FIG. 10 is a cross-sectional view of a circuit board obtained after applying a protective layer on the second wiring layer of FIG. 9.

In step S6, referring to FIG. 10, a protective layer 40 is applied on each second wiring layer 14 to obtain the circuit board 100.

In this embodiment, the protective layer 40 includes a solder mask ink. In another embodiment, the protective layer 40 may also be a covering layer (CVL) made of resin.

Referring to FIG. 10, an embodiment of the present disclosure further provides a circuit board 100. The circuit board 100 may be prepared by the above-mentioned manufacturing method.

The circuit board 100 includes a double-sided circuit substrate 20. The double-sided circuit substrate 20 includes a base layer 21 and two first conductive circuit layers 22 formed on opposite surfaces of the base layer 21. Each of the first wiring layers 22 includes a signal line 220. A region of the base layer 21 not covered by the signal line 220 defines two through holes 210, which are disposed on both sides of the signal line 220. A conductive paste block 211 is disposed in each of the through holes 210.

A copper plating layer 13, a dielectric layer 11, and a second wiring layer 14 are formed in that order on each first wiring layer 22. The dielectric layer 11 defines a groove 110 passing through the dielectric layer 11. The second wiring layer 14 forms the bottom wall 111 of the groove 110. The dielectric layer 11 further forms a sidewall 112 at the position of the groove 110, and the sidewall 112 is connected to the bottom wall 111. The copper plating layer 13 includes a first copper plating portion 131 and a second copper plating portion 132. The first copper plated portion 131 is formed on the bottom wall 111 and the sidewall 112. The second copper plating portion 132 is the portion of the copper plating layer 13 besides the first copper plating portion 131.

The conductive paste 211 electrically connects together the second copper plating portions 132 of the two copper plating layers 13 disposed on both sides of the dielectric layer 11. The second copper plating portion 132 forms a ground line. The first copper plating portion 131 forms a shielding layer. The shielding layer and the ground line on both sides of the base layer 21 and the conductive pastes 211 cooperatively form a closed shielding sleeve 30. The signal lines 220 are disposed within the shielding sleeve 30.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A manufacturing method of a circuit board, comprising:
providing a first double-sided copper laminate, wherein the first double-sided copper laminate comprises a dielectric layer, and a first copper foil layer and a copper plating layer formed on two surfaces of the dielectric layer, the dielectric layer defines a groove passing through the dielectric layer, the first copper foil layer is disposed on a side of the groove to form a bottom wall of the groove, the dielectric layer further forms a sidewall where the groove is defined, the sidewall is connected to the bottom wall, the copper plating layer comprises a first copper plating portion on the bottom wall and the sidewall and a second copper plating portion besides the first copper plating portion;
providing a double-sided circuit substrate, wherein the double-sided circuit substrate comprises a base layer and two first wiring layers formed on two surfaces of the base layer, each of the two first wiring layers comprises a signal line, a region of the base layer not covered by the signal line defines two conductive paste blocks, the two conductive paste blocks are disposed on two sides of the signal line;
stacking a first double-sided copper laminate on each of two sides of the double-sided circuit substrate, causing the signal line to be received in the groove to obtain an intermediate body;
pressing the intermediate body, causing the two conductive paste blocks to electrically connect to the second copper plating portions on the two sides of the base layer, wherein the second copper plating portion forms a ground line, the first copper plating portion forms a shielding layer, the shielding layer and the ground line on each of the two sides of the base layer and the two conductive paste blocks cooperatively form a closed shielding sleeve, the signal wire is disposed within the shielding sleeve; and etching the first copper foil layer of each first double-sided copper laminate to obtain a second conductive circuit layer, thereby obtaining the circuit board.

2. The manufacturing method of the circuit board according to claim 1, wherein a cross-sectional width of the groove gradually decreases from the dielectric layer to the first copper foil layer.

3. The manufacturing method of the circuit board according to claim 2, wherein a surface of the first copper plating portion away from the groove is arcuate.

4. The manufacturing method of the circuit board according to claim 1, wherein the dielectric layer is made of a thermosetting resin.

5. The manufacturing method of the circuit board according to claim 1, wherein projections of the signal lines of the two first wiring layers on the base layer overlap with each other, and the signal lines are disposed along a central axis of the shielding sleeve.

6. The manufacturing method of the circuit board according to claim 1, wherein a manufacturing method of the first double-sided copper laminate comprises:
providing a single-sided copper laminate, wherein the single-sided copper laminate comprises the dielectric layer and the first copper foil layer formed on the dielectric layer;
defining the groove in the dielectric layer; and
plating copper on a surface of the dielectric layer away from the first copper foil layer, the bottom wall, and the sidewall to form the copper plating layer, thereby obtaining the first double-sided copper laminate.

7. The manufacturing method of the circuit board according to claim 1, wherein a manufacturing method of the double-sided circuit substrate comprises:
providing a second double-sided copper laminate, wherein the second double-sided copper laminate comprises the base layer and two second copper foil layers formed on opposite surfaces of the base layer;
covering a photoresist pattern layer on each of the two second copper foil layers;
performing an exposure and development process on each of the two second copper foil layers through the photoresist pattern layer, to etch the two second copper foil layers into the two first wiring layers, thereby obtaining the double-sided circuit substrate.

8. The manufacturing method of the circuit board according to claim 1, wherein after etching the first copper foil layer, the manufacturing method further comprises:
covering a protective layer on each of the two second wiring layers.

9. The manufacturing method of the circuit board according to claim 1, wherein the groove comprises an opening on a surface of the dielectric layer away from the first copper foil layer, a distance between the two conductive paste blocks is equal to a width of the opening.

10. The manufacturing method of the circuit board according to claim 1, wherein the base layer is made of a thermosetting resin.

11. The manufacturing method of the circuit board according to claim 1, wherein the two conductive paste blocks comprise a copper paste or a solder paste.

12. The manufacturing method of the circuit board according to claim 1, wherein the groove is formed by punching, numerical-controlled drilling, or laser drilling.

13. A circuit board comprising:
a double-sided circuit substrate, wherein the double-sided circuit substrate comprises a base layer and two first wiring layers formed on two surfaces of the base layer, each of the two first wiring layers comprises a signal line, two conductive paste blocks are disposed in a region of the base layer not covered by the signal line, the two conductive paste blocks are disposed on two sides of the signal line; and
a copper plating layer, a dielectric layer, and a second wiring layer formed in that order on each of the two first wiring layers, wherein the dielectric layer defines a groove passing through the dielectric layer, the first copper foil layer is disposed on a side of the groove to form a bottom wall of the groove, the dielectric layer further forms a sidewall where the groove is defined, the sidewall is connected to the bottom wall, the copper plating layer comprises a first copper plating portion on the bottom wall and the sidewall and a second copper plating portion besides the first copper plating portion;
wherein the two conductive paste blocks are electrically connected to the second copper plating portions on the two sides of the base layer, wherein the second copper plating portion forms a ground line, the first copper plating portion forms a shielding layer, the shielding layer and the ground line on each of the two sides of the base layer and the two conductive paste blocks cooperatively form a closed shielding sleeve, the signal wire is disposed within the shielding sleeve.

14. The circuit board according to claim 13, wherein a cross-sectional width of the groove gradually decreases from the dielectric layer to the first copper foil layer.

15. The circuit board according to claim 14, wherein a surface of the first copper plating portion away from the groove is arcuate.

16. The circuit board according to claim 13, wherein the dielectric layer is made of a thermosetting resin.

17. The circuit board according to claim 13, wherein projections of the signal lines of the two first wiring layers on the base layer overlap with each other, and the signal lines are disposed along a central axis of the shielding sleeve.

18. The circuit board according to claim 13, wherein the groove comprises an opening on a surface of the dielectric layer away from the first copper foil layer, a distance between the two conductive paste blocks is equal to a width of the opening.

19. The circuit board according to claim 13, wherein the base layer is made of a thermosetting resin.

20. The circuit board according to claim 13, wherein the two conductive paste blocks comprise a copper paste or a solder paste.

* * * * *